(12) United States Patent
Libsch et al.

(10) Patent No.: US 11,043,270 B1
(45) Date of Patent: Jun. 22, 2021

(54) SOC PACKAGE WITH INTEGRATED ULTRAVIOLET LIGHT SOURCE

(71) Applicant: International Business Machines Corporation, Armonk, NY (US)

(72) Inventors: Frank Robert Libsch, White Plains, NY (US); Ali Afzali-Ardakani, Ossining, NY (US); James B. Hannon, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/867,171

(22) Filed: May 5, 2020

(51) Int. Cl.
*G11C 16/04* (2006.01)
*H01L 27/11517* (2017.01)
*G11C 16/18* (2006.01)

(52) U.S. Cl.
CPC .......... *G11C 16/0416* (2013.01); *G11C 16/18* (2013.01); *H01L 27/11517* (2013.01)

(58) Field of Classification Search
None
See application file for complete search history.

(56) References Cited

U.S. PATENT DOCUMENTS

| | | | |
|---|---|---|---|
| 5,109,261 A | 4/1992 | Mead et al. | |
| 5,353,382 A | 10/1994 | Yariv et al. | |
| 5,438,216 A * | 8/1995 | Juskey | G11C 5/00 257/433 |
| 5,487,026 A | 1/1996 | Robinson | |
| 6,583,444 B2 | 6/2003 | Fjelstad | |
| 7,820,491 B2 | 10/2010 | Rao et al. | |
| 9,263,124 B2 | 2/2016 | Lujan et al. | |
| 10,269,860 B2 | 4/2019 | Ang et al. | |
| 2019/0311256 A1 | 10/2019 | Hack | |

FOREIGN PATENT DOCUMENTS

GB    2265036 B    8/1995

OTHER PUBLICATIONS

Ishiguro, Y., et al., "Optical switching of carrier transport in polymeric transistors with photochromic spiropyran molecules", J. Mater. Chem. C, Accepted Mar. 6, 2013, pp. 3012-3016, 1.
Guo, X., et al., "Reversible Photo Regulation of the Electrical Conductivity of Spiropyran-Doped Polyaniline for Information Recording and Nondestructive Processing", Adv. Mater. Apr. 5, 2004, pp. 636-640, No. 7, 16.
Jang, A.-R., et al., "Reversibly Light-Modulated Dirac Point of Graphene Functionalized with Spiropyran", ACS Nano, Published online Sep. 13, 2012, pp. 9207-9213, vol. 6, No. 10.
Malic, E., et al., "Microscopic Model of the Optical Absorption of Carbon Nanotubes Functionalized with Molecular Spiropyran Photoswitches", Physical Review Letters, Mar. 4, 2011, pp. 097401-1 to 097401-4, 106.

* cited by examiner

*Primary Examiner* — James G Norman
(74) *Attorney, Agent, or Firm* — Scully, Scott. Murphy & Presser, P.C.; Daniel P. Morris

(57) ABSTRACT

Programmable devices and methods for fabricating the programmable devices are described. In an example, a method for fabricating a programmable device can include bonding a UV light source to a computer chip by flip-chip mounting the UV light source to the computer chip. The UV light source can be configured to emit UV light towards a UV erasable area of the computer chip to perform UV erasing on the computer chip. The method can further include bonding a carrier to the computer chip by flip chip mounting the computer chip to the carrier using a second array of bond pads.

20 Claims, 16 Drawing Sheets

SOC PACKAGE WITH INTEGRATED ULTRAVIOLET LIGHT SOURCE

BACKGROUND

The present disclosure relates in general to a system on chip (SoC) package that is integrated with an ultraviolet (UV) light source.

In some examples, ultraviolet (UV) light can be used for erasing or deleting data being stored on a programmable computer chip. Some examples of programmable chips can include electrically programmable read only memory (EPROM), UV erasable read only memory (ROM), and other types of programmable computer chips. The UV light can remove charge (e.g., electrons) from a floating gate, causing changes to the computer chips transistor threshold and memory state. Further, structures or particular computer chips (e.g., neuromorphic inference chips, artificial intelligence chips) made of ionic conducting polymers can rely on UV light exposure to move or remove ions to alter the resistivity of the structure.

SUMMARY

In some examples, a chip package is generally described. The chip package can include a computer chip, an ultraviolet (UV) light source, and a carrier. The UV light source can be flip-chip mounted to the computer chip using a first array of bond pads situated between the UV light source and the computer chip. The computer chip can be flip-chip mounted to the carrier using a second array of bond pads situated between the computer chip and the carrier. The UV light source can be configured to emit UV light towards a UV erasable area of the computer chip to perform UV erasing on the computer chip.

In some examples, a chip package is generally described. The chip package can include a computer chip, an ultraviolet (UV) light source, and a carrier. The UV light source can be flip-chip mounted to the computer chip using a first array of bond pads situated between the UV light source and the computer chip. The computer chip can be flip-chip mounted to the carrier using a second array of bond pads situated between the computer chip and the carrier. The carrier can include a recess to fit a portion of the UV light source. The UV light source can be configured to emit UV light towards a UV erasable area of the computer chip to perform UV erasing on the computer chip.

In some examples, a method for fabricating a programmable device is generally described. The method includes bonding a UV light source to a computer chip by flip-chip mounting the UV light source to the computer chip. The UV light source can be configured to emit UV light towards a UV erasable area of the computer chip to perform UV erasing on the computer chip. The method can further include bonding a carrier to the computer chip by flip chip mounting the computer chip to the carrier using a second array of bond pads.

Further features as well as the structure and operation of various embodiments are described in detail below with reference to the accompanying drawings. In the drawings, like reference numbers indicate identical or functionally similar elements.

DETAILED DESCRIPTION

Figure 1A:
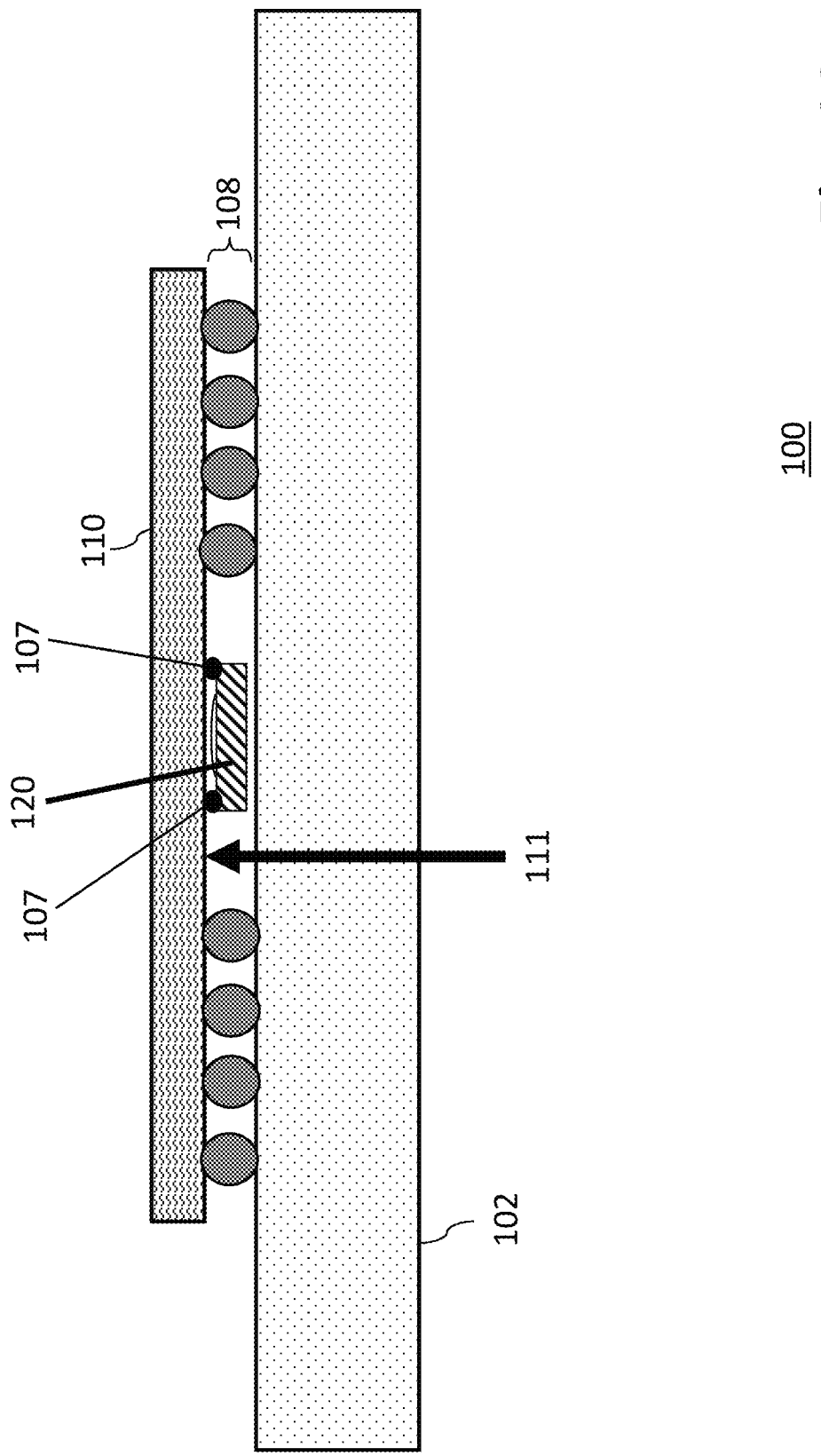
FIG. 1A is a diagram showing a cross section of a chip package that can be implemented as a system on chip package with integrated ultraviolet light source in one embodiment.

In some examples, memory packages such as EPROMs can be programmable by exposing a window on a surface of the EPROM memory device to UV light to erase or delete data stored in the EPROM device, and thereafter reprogrammed using a programming (e.g., burn) and test cycle. This window on the EPROM memory can be a quartz window, or other UV transparent insulator material that may be used as a topside layer of the memory package where integrated circuits can be mounted. However, quartz windows can be relatively expensive, and the other UV transparent materials may not have sufficient resistance to moisture, hydrogen, and ionic contaminants. In some examples, EPROM devices can be manufactured having a UV transparent passivation layer of silicon dioxide mounted on a ceramic package having a relatively thick quartz window. The passivation layer can have relatively poor barrier properties as discussed above. The quartz and ceramic package can be considered to provide a reliable barrier to moisture and hydrogen, but can become costly to manufacture due to the costs of fabricating the ceramic or quartz packaging.

The UV erasing process can be a blanket erasure of all the memory elements. For example, the process does not selectively erase particular memory elements. The UV erasing process can be provided by a source external to the chip, such as a mercury-vapor lamp. Thus, to perform UV erasing on a computer chip, the computer chip may need to be removed from devices and may need to be moved to a location with access to the UV light source. To be described in more detail below, the chip package being described in accordance with the present disclose can provide a UV source chip integrated with a computer chip. Further, the bonding and assembly packaging method to fabricate this chip package can be compatible with higher throughput, can be more cost-effective wafer-to-wafer, many chips-to-wafer, or many chips-to-many chips parallel assembly. Furthermore, the bonding and assembly packaging method to fabricate this chip package can use existing microfabrication tools and techniques to enable scalability to smaller integrated UV source on system package dimensions beyond what is capable with conventional 2.5D and 3D packages.

Other advantages of the bonding and assembly packaging method to fabricate the chip package being described in accordance with the present disclosure can include compatibility with parallel aligned multi-chip pick and place methods and tooling; enabling higher throughput process compared to conventional serial chip handling, resulting in lower cost; bonding hierarchy compatible with different existing chip technologies such as Gallium Nitride (GaN) UV light-emitting diode (LED) chips, artificial intelligence (AI) silicon system chips with programmable ionic conducting polymer weights, and/or other existing chip technology; enables chip on system bond and assembly size scaling to smaller package dimensions than what is possible with the conventional 2.5D package; enables precise (sub-micron) assembly as needed by UV source chip by employing the higher yielding and higher accuracy microfabrication alignment tools rather than the conventional packaging area tools after wafer fab; assembly process produces hermetically metal sealed package without additional processing or needing an expensive ceramic package; integrated UV light source inside of package eliminates conventional expensive ceramic package with expensive quartz window; and enables in-field and reconfigurable UV exposure.

FIG. 1A is a diagram showing a cross section of a chip package 100 that can be implemented as a system on chip package with integrated ultraviolet light source in one embodiment. The chip package 100 can include a computer chip 110, a light source 120, and a carrier 102. The computer chip 110 can be, for example, an artificial intelligence computer chip, or a computer chip that may require UV exposure to change the conductivity, threshold, or other state of structures or devices contained there-in. The carrier 102 can be a printed circuit board (PCB), and can be made of organic materials. The light source 120 can be a UV light source configured to emit light of UV wavelength.

The light source 120 can be bonded or mounted to the computer chip 110 using an array of bond pads 107. In the example shown in FIG. 1A, the light source 120 can be flip-chip mounted to a surface 111 of the computer chip 110. The flip-chip mounting of the light source 120 can allow the light source 120 to emit light towards the surface 111 of the computer chip 110. The surface 111 can be a top surface of the computer chip 110. For example, processing and memory components of the computer chip 110 can be exposed on the surface 111. The computer chip 110 can be bonded or mounted to the carrier 102 using an array of bond pads 108. In the example shown in FIG. 1A, the computer chip 110 can be flip-chip mounted to a surface of the carrier 102. The arrays of bond pads 107, 108 can be controlled collapse chip connection (C4) solder bumps.

Figure 1B:
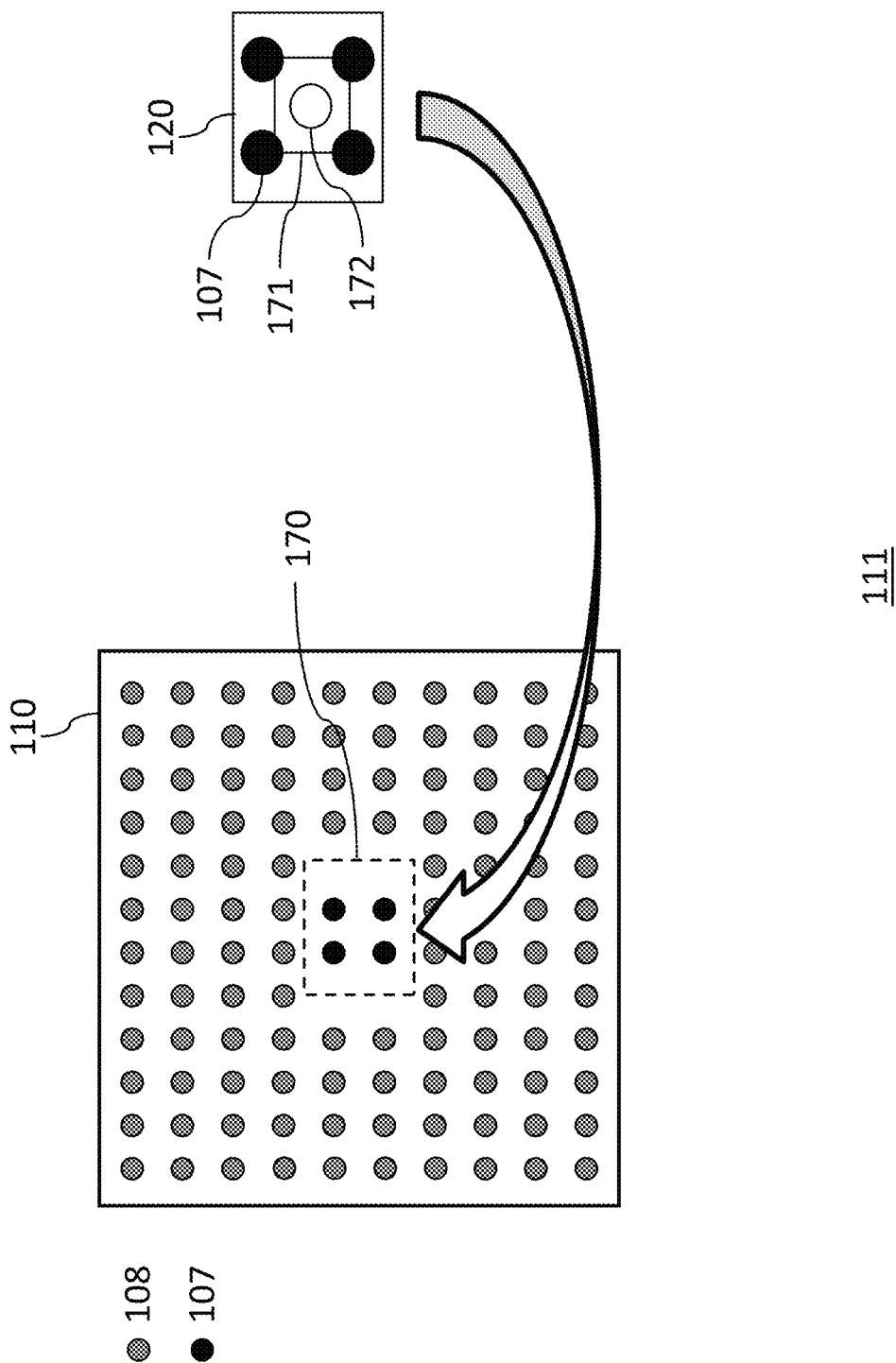
FIG. 1B is a diagram showing a surface of a computer chip of a system on chip package with integrated ultraviolet light source in one embodiment.

FIG. 1B is a diagram showing the surface 111 of the computer chip 110 of a system on chip package with integrated ultraviolet light source in one embodiment. In an example shown in FIG. 1B, the light source 120 can include a light emitter 171 that can be, for example, a light-emitting diode (LED) or a laser configured to emit light in UV wavelength. The light source 120 can further include a lens 172. The lens 172 can be disposed or situated on a top surface of the light emitter 171. The light source 120 can be flip-chip mounted to the surface 111 of the computer chip 110 using the bond pads 107. In the example shown in FIG. 1B, the light source 120 can be flip-chip mounted to a UV erasable area 170 of the computer chip 110. Flip-chip mounting the light source 120 to the surface 111 can allow the light emitter 171 to emit UV light towards the UV erasable area 170 via the lens 172. A size and location of the UV erasable area 170 can be dependent on a desired implementation of the chip package 100.

The lens 172 can be a focusing lens or a defocusing lens. In some examples, the lens 172 can be a lens designed to accommodate artificial intelligence (AI) illumination applications. The lens 172 can be made of glass, quartz, plastic, or other materials. In some examples, the lens 172 can be a separate lens or component from the light emitter 171, and can be aligned to the light emitter 171 or a dielectric layer of the light emitter 171. The lens 172 can also be fabricated onto GaN LED substrate (of the light emitter 171), or etched to the mechanical lens focal geometry required. For example, during the fabrication of the light source 120 (e.g., a light source of GaN), the surface of GaN material itself can have a particular shape or a particular type of lens, such as radii of curvature and a focal length within a wide range. One way this can be accomplished is by melting photoresist that were transferred by reactive ion etching (RIE) into the GaN. By controlling the etching rates of the photoresist mask and the underlying GaN material, radii of curvature and focal lengths within a wide range can be achieved. If the lens 172 is fabricated onto GaN LED substrate (e.g., sapphire), the GaN substrate can be thinned and bonded.

Figure 1C:
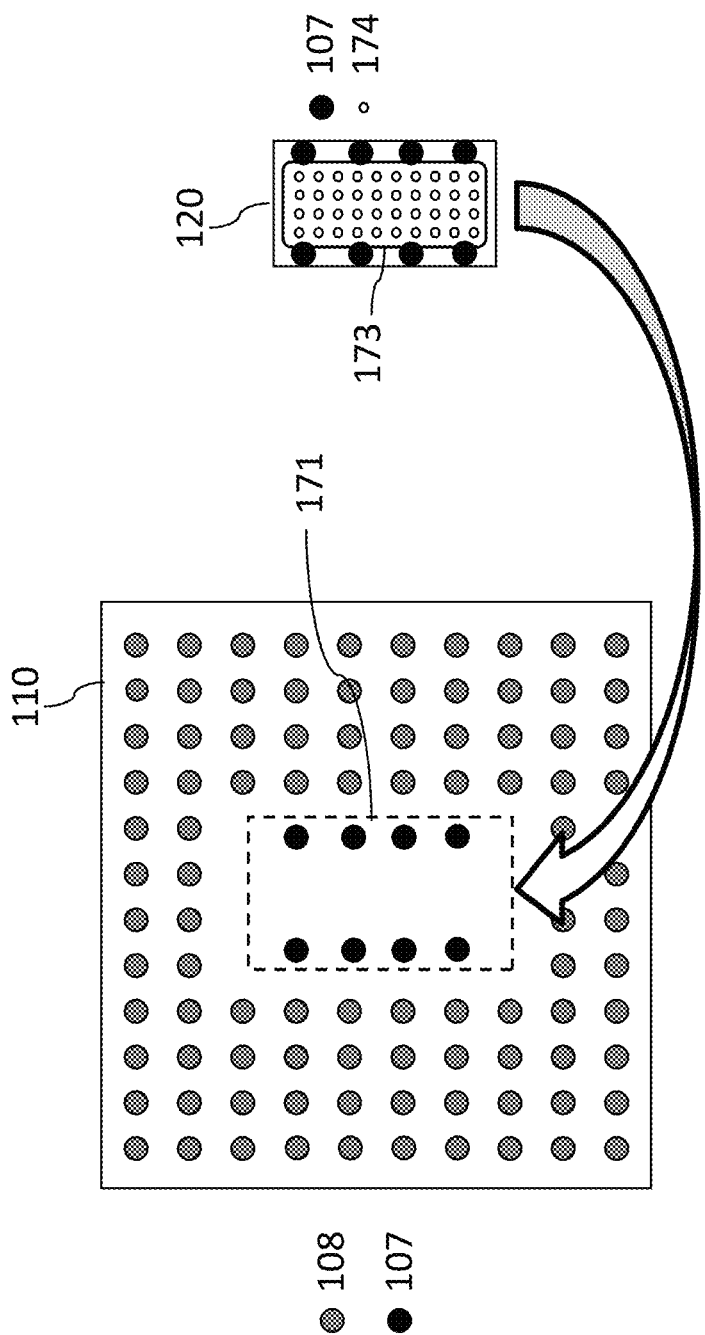
FIG. 1C is a diagram showing a surface of a computer chip of a system on chip package with integrated ultraviolet light source in another embodiment.

FIG. 1C is a diagram showing the surface 111 of the computer chip 110 of a system on chip package with integrated ultraviolet light source in one embodiment. In the example shown in FIG. 1C, the light source 120 can include a light emitter 173 that can include, for example, an array of LEDs or an array of lasers, configured to emit light at UV wavelength. The light source 120 can further include an array of lenses 174. The array of lenses 174 can be disposed or situated on a top surface of the light source 120. The light source 120 can be flip-chip mounted to the surface 111 of the computer chip 110 using the bond pads 107. In the example shown in FIG. 1C, the light source 120 can be flip-chip mounted to a UV erasable area 171 of the computer chip 110. Flip-chip mounting the light source 120 to the surface 111 can allow the light emitter 173 to emit light towards the UV erasable area 171 of the computer chip 110. A size and location of the UV erasable area 171 can be arbitrary and can be dependent on a desired implementation of the chip package 100.

The array of lenses 174 can include focusing lenses or defocusing lenses. In some examples, the array of lenses 174 can include lenses designed to accommodate artificial intelligence (AI) illumination applications. The array of lenses 174 can be made of glass, quartz, plastic, or other materials. In some examples, the array of lenses 174 can be separate lenses or components from the light emitter 173 and can be aligned to the array of LEDs or lasers, or a dielectric layer, of the light emitter 173. The ratio of the number of lenses among the array of lenses 174, to the number of LEDs or lasers of the light emitter 173, can be based on a desired implementation of the chip package 100. The array of lenses 174 can also be fabricated onto a GaN LED substrate (e.g., substrate of the light emitter 173) having an array of GaN LEDs by, for example, or etched to mechanical lenses focal geometry required. If the array of lenses 174 is fabricated onto GaN LED substrate (e.g., sapphire), the GaN substrate can be thinned and bonded.

Figure 2A:
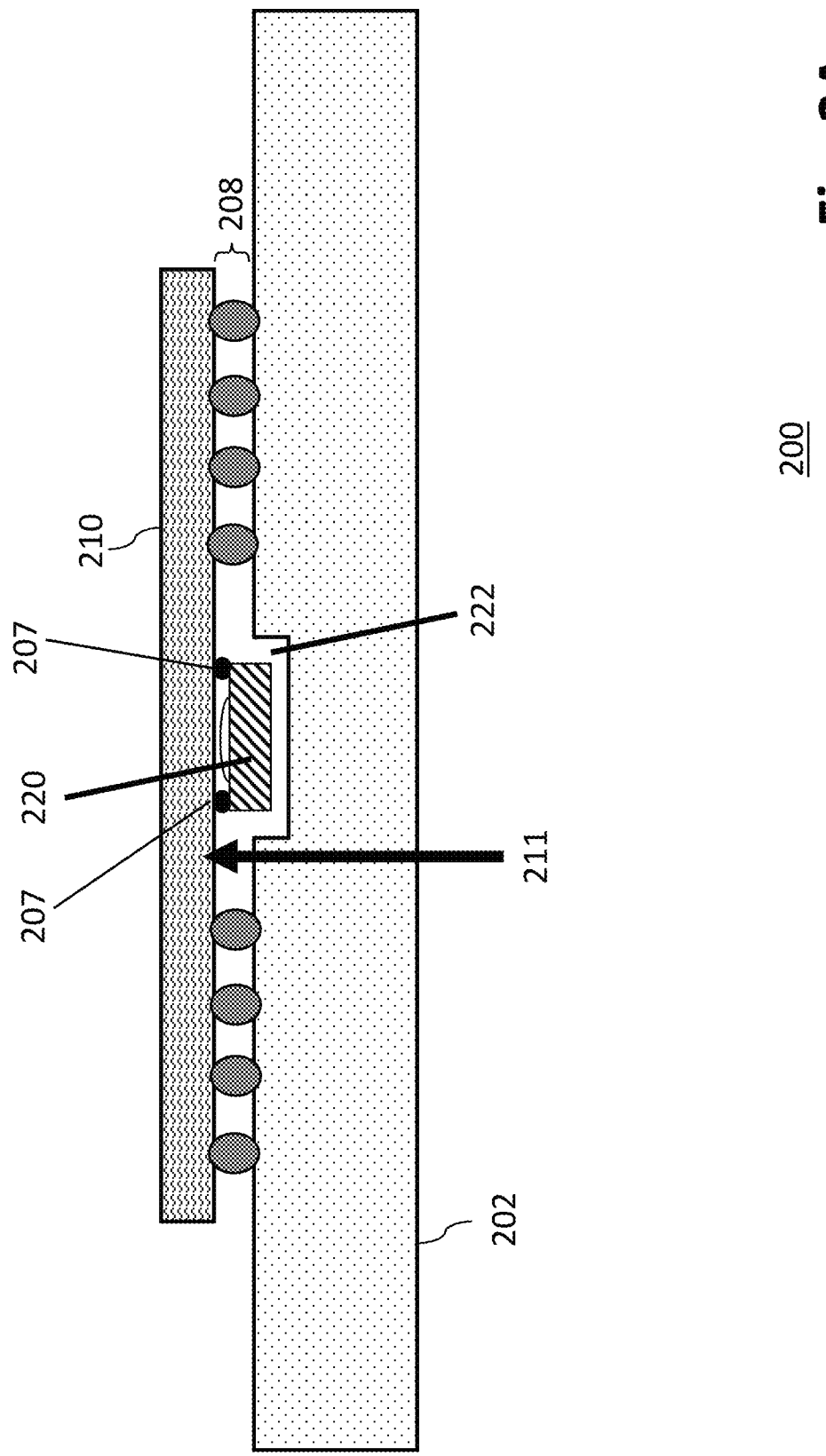
FIG. 2A is a diagram showing a cross section of another chip package that can be implemented as a system on chip package with integrated ultraviolet light source in one embodiment.

FIG. 2A is a diagram showing a cross section of another chip package 200 that can be implemented as a system on chip package with integrated ultraviolet light source in one embodiment. The chip package 200 can include a computer chip 210, a light source 220, and a carrier 202. The computer chip 210 can be, for example, an artificial intelligence computer chip, or a computer chip that may require UV exposure to change the conductivity, threshold, or other state of structures or devices contained there-in. The carrier 202 can be a printed circuit board (PCB), and can be made of organic materials. The light source 220 can be a UV light source configured to emit light of UV wavelength.

The light source 220 can be bonded or mounted to the computer chip 210 using an array of bond pads 207. The surface 211 can include UV erasable areas (e.g., UV erasable area 170 in FIG. 1B or UV erasable area 171 in FIG. 1C). The light source 220 can be flip-chip mounted to a UV erasable area on the surface 211 of the computer chip 210. The flip-chip mounting of the light source 220 can allow the light source 220 to emit light towards the surface 211 of the computer chip 210. The surface 211 can be a top surface of the computer chip 210. For example, processing and memory components of the computer chip 210 can be exposed on the surface 211. The computer chip 210 can be bonded or mounted to the carrier 202 using an array of bond pads 208. In the example shown in FIG. 2A, the computer chip 210 can be flip-chip mounted to a surface of the carrier 202. The arrays of bond pads 207, 208 can be controlled collapse chip connection (C4) solder bumps. The light source 220 can be a UV light source including a single lens (e.g., lens 172 in FIG. 1B) or a UV light source including an array of lenses (e.g., array of lenses 174 in FIG. 1C). In the example shown in FIG. 2A, a recess 222 can be formed on a surface of the carrier 202 to accommodate or fit the light source 220 upon mounting the computer chip 210 to the carrier 202. For example, the recess 222 can fit relatively thicker UV light source chips, or can allow the computer chip 210 to be flip-chip mounted to the carrier 202 using relatively smaller bond pads (e.g., bond pads 208). The carrier 202 can also include another layer of bond pads 209 that can be used to bond or mount the chip package 200 to another package or device.

Further, thermally conductive paths can be installed in at least a portion of the recess 222 to cool the light source 220 and/or the computer chip 210. In an example shown in FIG. 2B the computer chip 200 can further include a package lid 230, one or more traces 260, and one or more seals 261. The package lid 230 can be a conductive lid and can be made of, for example, copper. Note that other packaging lid materials are possible, such as aluminum, aluminum nitride, gold, material that is thermally conductive, soft materials that can easily be shaped, and/or similar materials. The traces 260 can be copper organic PCB traces that can be in contact with the light source 220, and can be installed in at least a portion of the recess 222. The traces 260 can be made of thermally interface materials or copper conductors, and can be implemented as thermally conductive paths to cool the light source 220 and/or the computer chip 210. The seals 261 can be hermetical metal seals made of, for example, copper, and can be solder between the package lid 230 and the traces 260. The combination of the package lid 230, the traces 260, and the seals 261 can provide a thermally conductive path to cool the light source 220 and/or the computer chip 210. In some examples, a heat sink can be disposed on the package lid 230 to provide additional cooling capabilities.

Figure 2B:
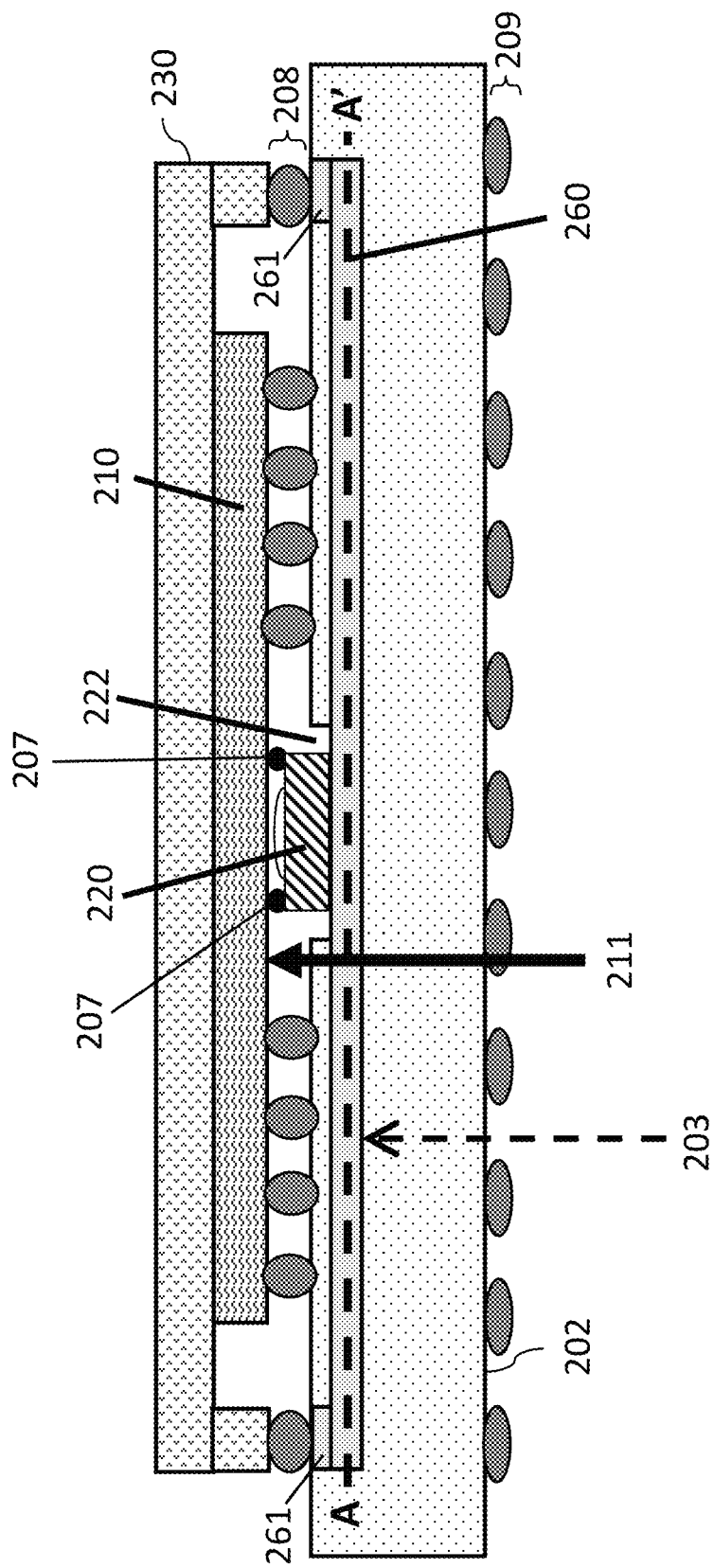
FIG. 2B is a diagram showing a cross section of the chip package of FIG. 2A in one embodiment.
Figure 2C:
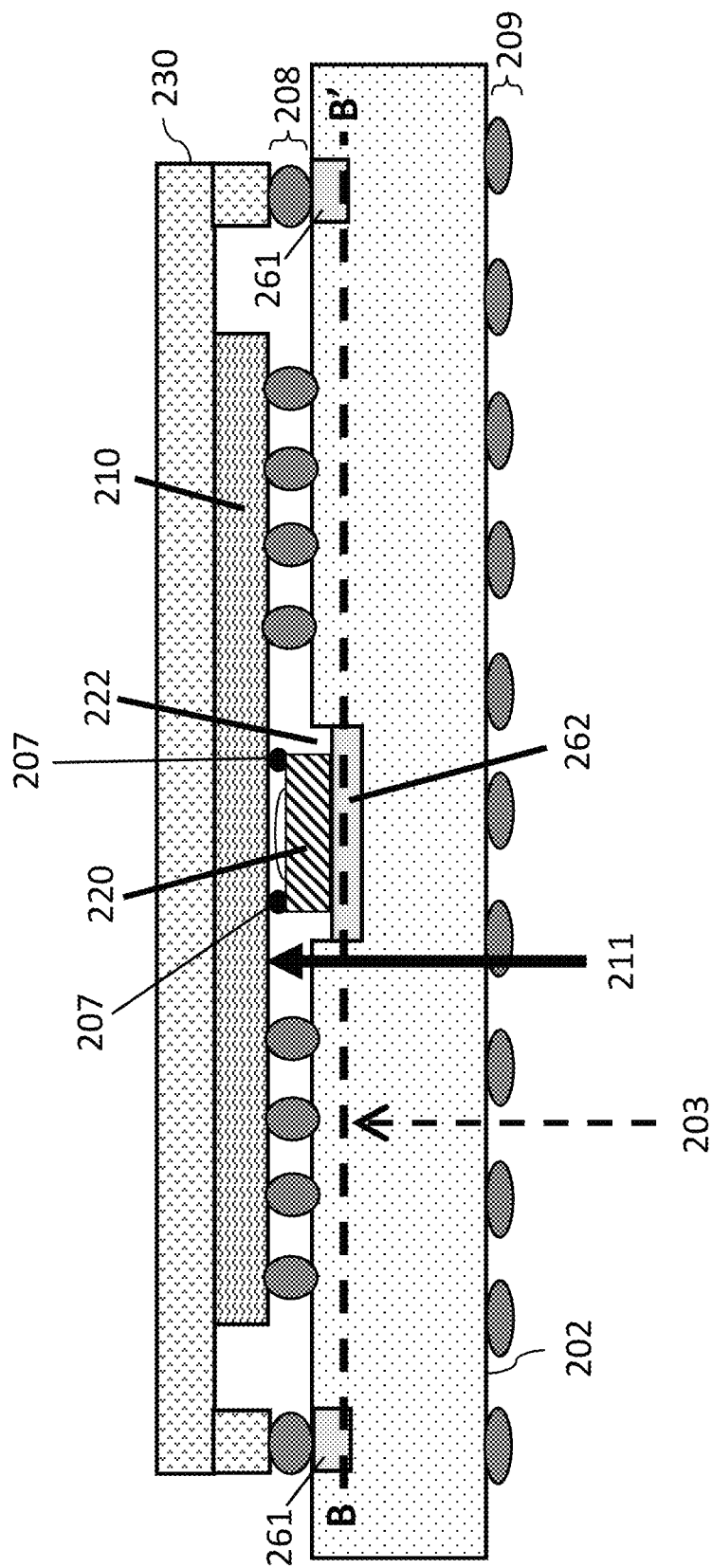
FIG. 2C is a diagram showing another cross section of the chip package of FIG. 2A in one embodiment.

The example shown in FIG. 2B is a cross section of a side perspective view of the computer chip 200. FIG. 2C presents an example showing a cross section of another side perspective view of the computer chip 200. In the side perspective view shown in FIG. 2C, the computer chip 200 can further include one or more traces 262, where traces 262 can be copper organic PCB traces that can be in contact with the light source 220, and can be installed in at least a portion of the recess 222. The traces 262 can be implemented as a heat pipe to facilitate cooling of the light source 220 and/or the computer chip 210.

Figure 2D:
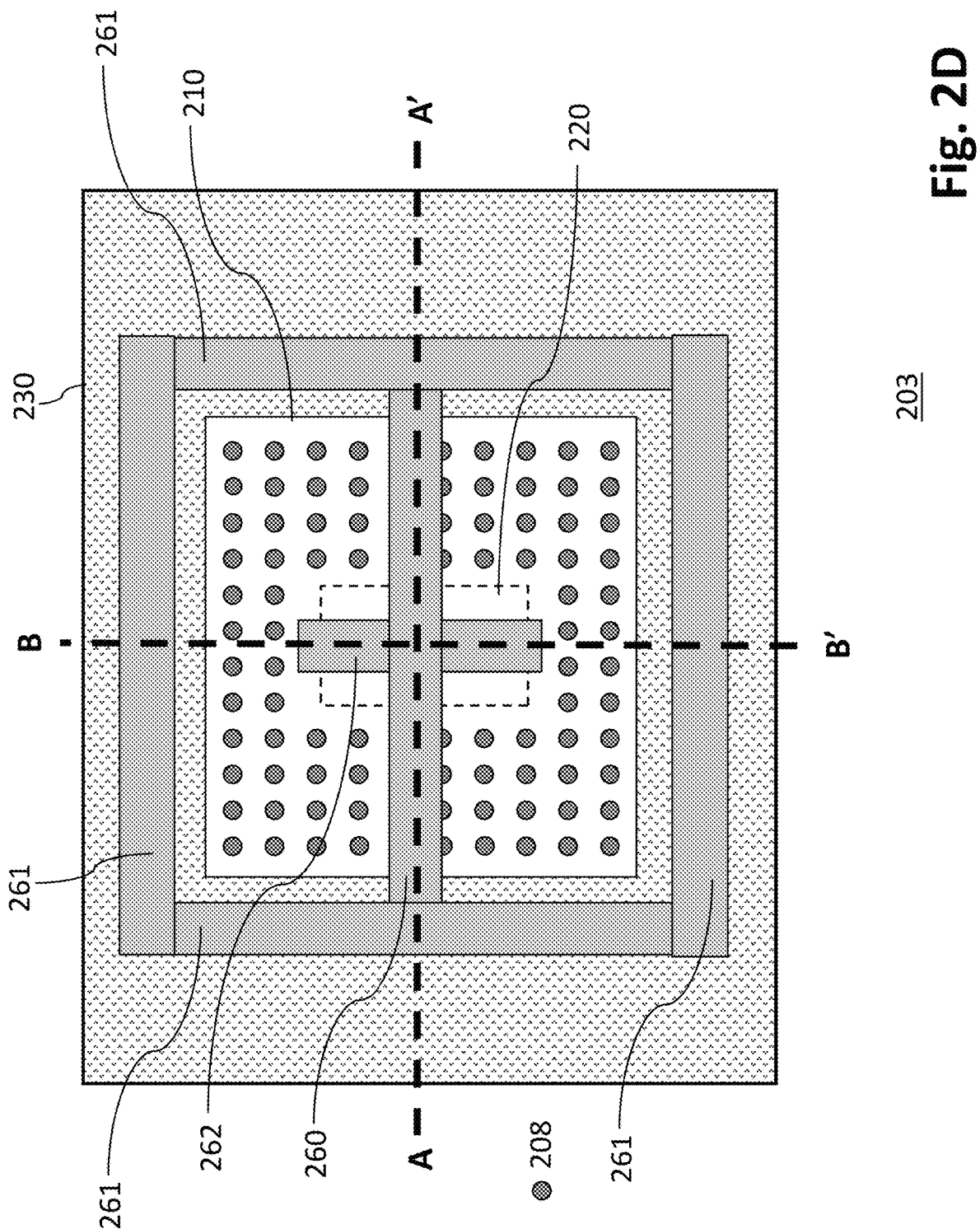
FIG. 2D is a diagram showing a layout of traces in a system on chip package with integrated ultraviolet light source in one embodiment.

FIG. 2D is a diagram showing a layout of traces in a system on chip package with integrated ultraviolet light source in one embodiment. The example shown in FIG. 2D presents a layout of the traces 260 and 262 that can be visible in a view 203, where the view 203 can be a bottom view as indicated by a dotted arrow in FIG. 2B and FIG. 2C. A section A-A' that spans along the traces 260, from one seal 261 to another seal 261, in FIG. 2B can be visible in the view 203 as shown in FIG. 2D. Another section B-B' in FIG. 2C can be visible in the view 203 as shown in FIG. 2D. The section B-B' can span along the traces 262, where the traces 262 need not contact the seals 261 but can be in contact with the light source 220 and the traces 260. The traces 260 and the traces 262 can be non-parallel to each other, and may be perpendicular to each other in some embodiments.

The orientation and position of the trances 260 and traces 262 can be dependent on a desired implementation of the chip package 200. The size of the traces 260 and 262 can also be adjustable, and can be based on a desired implementation of the chip package 200. Further, the size, shapes, orientation, and positions of the traces 260, 262 can be based on the size and positions of the light source 220, the UV erasable area of the computer chip 210, and the bond pads (e.g., 207, 208). The traces 260 and 262 can also be co-designed with electrical C4 escape to prevent the traces 260 and 262 from interfering with the carrier 202.

By contacting the light source 220 and the traces 260, the traces 262 can be implemented as a heat pipe that transfers heat dissipated from the light source 220 to the traces 260. The heat can flow from the traces 260 to the seals 261, and from the seals 261 to the package lid 230. The combination of the traces 260, 262, and the package lid 230 can provide a network of thermal pipe to facilitate cooling of the light source 220. Further, the computer chip 210 can also be cooled based on the computer chip 210 being integrated with the light source 220.

Figure 3A:
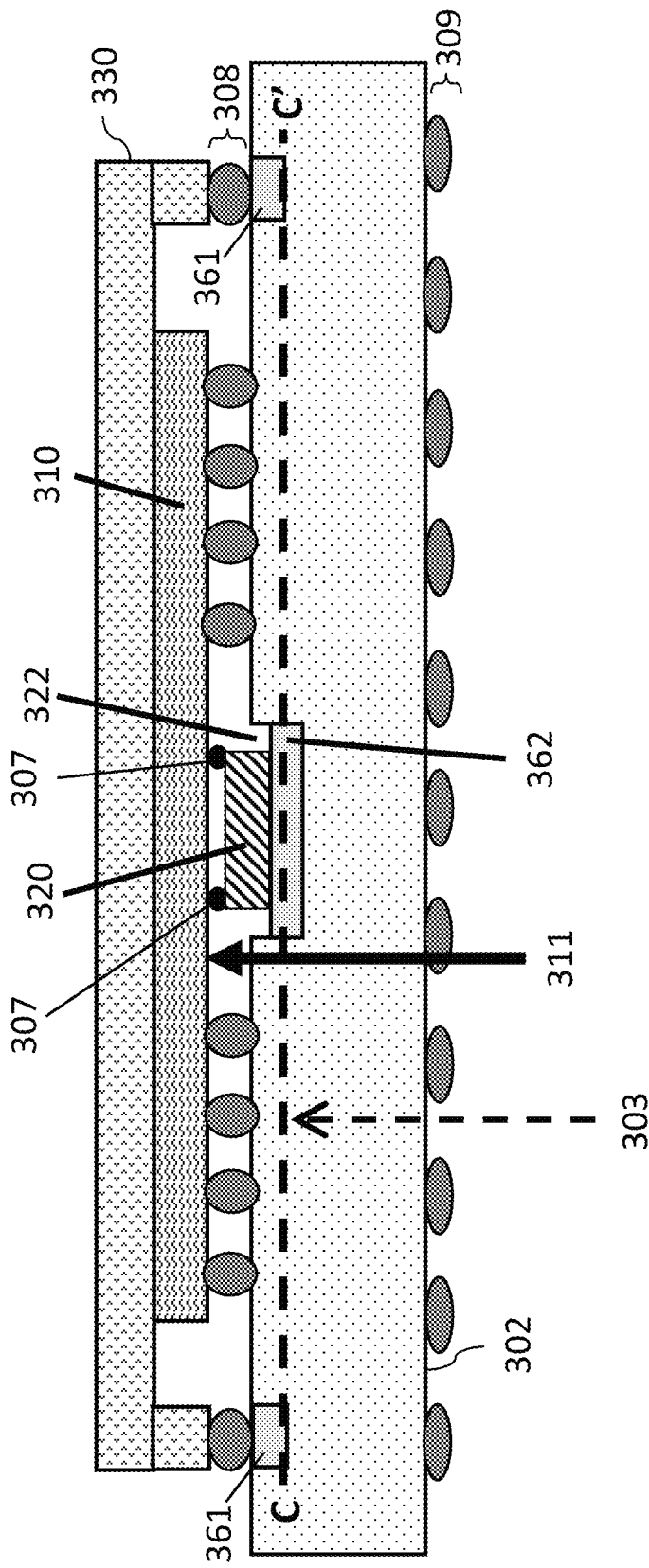
FIG. 3A is a diagram showing a cross section of another chip package that can be implemented as a system on chip package with integrated ultraviolet light source in one embodiment.

FIG. 3A is a diagram showing a cross section of a chip package 300 that can be implemented as a system on chip package with integrated ultraviolet light source in one embodiment. The chip package 300 can include a computer chip 310, a light source 320, and a carrier 302. The computer chip 310 can be, for example, an artificial intelligence computer chip, or a computer chip that may require UV exposure to change the conductivity, threshold, or other state of structures or devices contained there-in. The carrier 302 can be a printed circuit board (PCB), and can be made of organic materials. The light source 320 can be a UV light source configured to emit light of UV wavelength.

The light source 320 can be bonded or mounted to the computer chip 310 using an array of bond pads 307. The surface 311 can include UV erasable areas (e.g., UV erasable area 170 in FIG. 1B or UV erasable area 171 in FIG. 1C). The light source 320 can be flip-chip mounted to a UV erasable area on the surface 311 of the computer chip 310. The flip-chip mounting of the light source 320 can allow the light source 320 to emit light towards the surface 311 of the computer chip 310. The surface 311 can be a top surface of the computer chip 310. For example, processing and memory components of the computer chip 310 can be exposed on the surface 311. The computer chip 310 can be bonded or mounted to the carrier 302 using an array of bond pads 308. In the example shown in FIG. 3A, the computer chip 310 can be flip-chip mounted to a surface of the carrier 302. The arrays of bond pads 307, 308 can be controlled collapse chip connection (C4) solder bumps. The light source 320 can be a UV light source including a single lens (e.g., lens 172 in FIG. 1B) or a UV light source including an array of lenses (e.g., array of lenses 174 in FIG. 1C). In the example shown in FIG. 3A, a recess 322 can be formed on a surface of the carrier 302 to accommodate or fit the light source 320 upon mounting the computer chip 310 to the carrier 302. For example, the recess 322 can fit relatively thicker UV light source chips, or can allow the computer chip 310 to be flip-chip mounted to the carrier 302 using relatively smaller bond pads (e.g., bond pads 308). The carrier 302 can also include another layer of bond pads 309 that can be used to bond or mount the chip package 300 to another package or device.

Further, thermally conductive paths can be installed in at least a portion of the recess 322 to cool the light source 320 and/or the computer chip 310. In an example shown in FIG. 3A, the chip package 300 can further include a package lid 330, one or more traces 362, and one or more seals 361. The package lid 330 can be a conductive lid and can be made of, for example, copper. Note that other packaging lid materials are possible. The traces 362 can be copper organic PCB traces that can be in contact with the light source 320, and can be installed in at least a portion of the recess 322. The traces 362 can be made of thermally interface materials or copper conductors, and can be implemented as thermally conductive paths to cool the light source 320 and/or the computer chip 310. The seals 361 can be hermetical metal seals made of, for example, copper, and can be solder between the package lid 330 and traces within the carrier 302. The combination of the package lid 330, the traces 362, and the seals 361 can provide a thermally conductive path to cool the light source 320 and/or the computer chip 310. In some examples, a heat sink can be disposed on the package lid 330 to provide additional cooling capabilities.

Figure 3B:
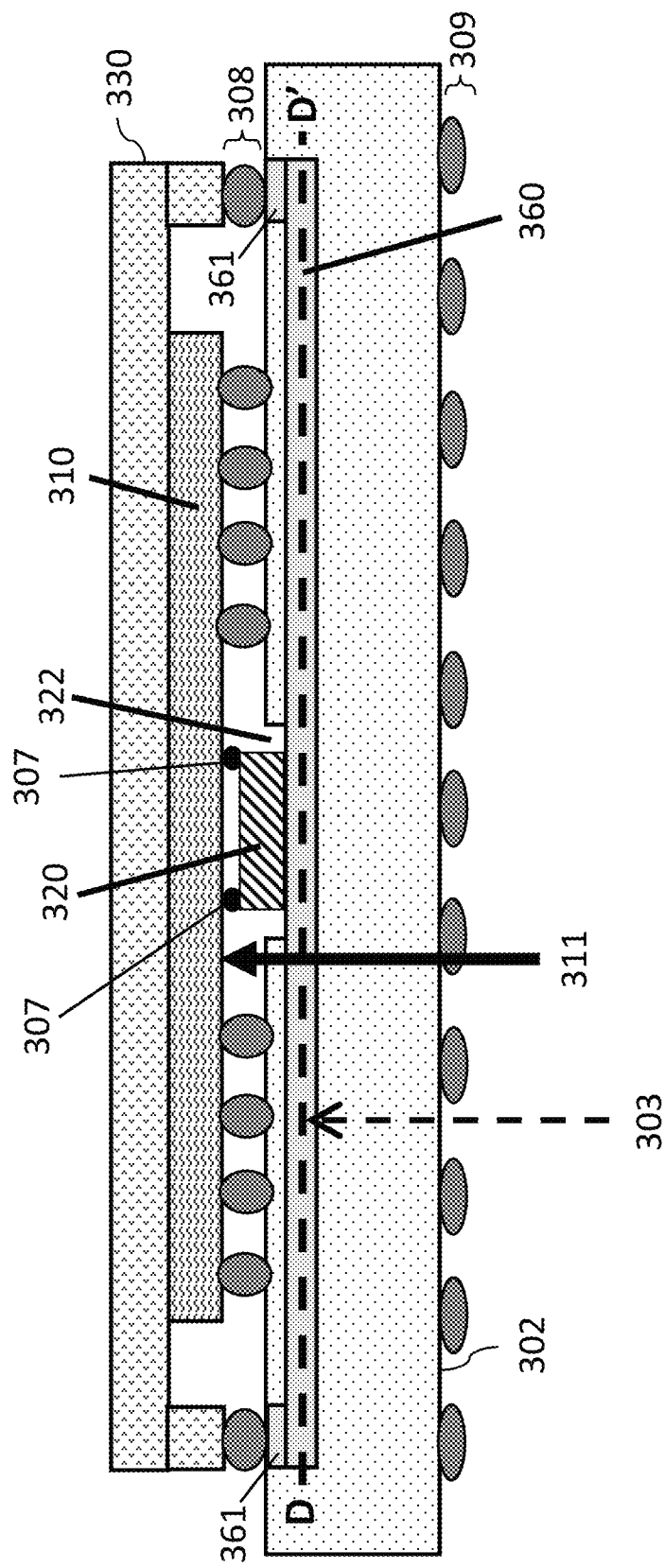
FIG. 3B is a diagram showing another cross section of the chip package of FIG. 3A in one embodiment.

FIG. 3B presents an example showing a cross section of another side perspective view of the chip package 300. In the side perspective view shown in FIG. 3B, the chip package 300 can further include one or more traces 360, where traces 360 can be copper organic PCB traces that can be in contact with the light source 320, and can be installed in at least a portion of the recess 322. One or more seals 361 can be solder between the package lid 330 and the traces 360. The traces 360 can be implemented as a heat pipe to facilitate cooling of the light source 320 and/or the computer chip 310.

Figure 3C:
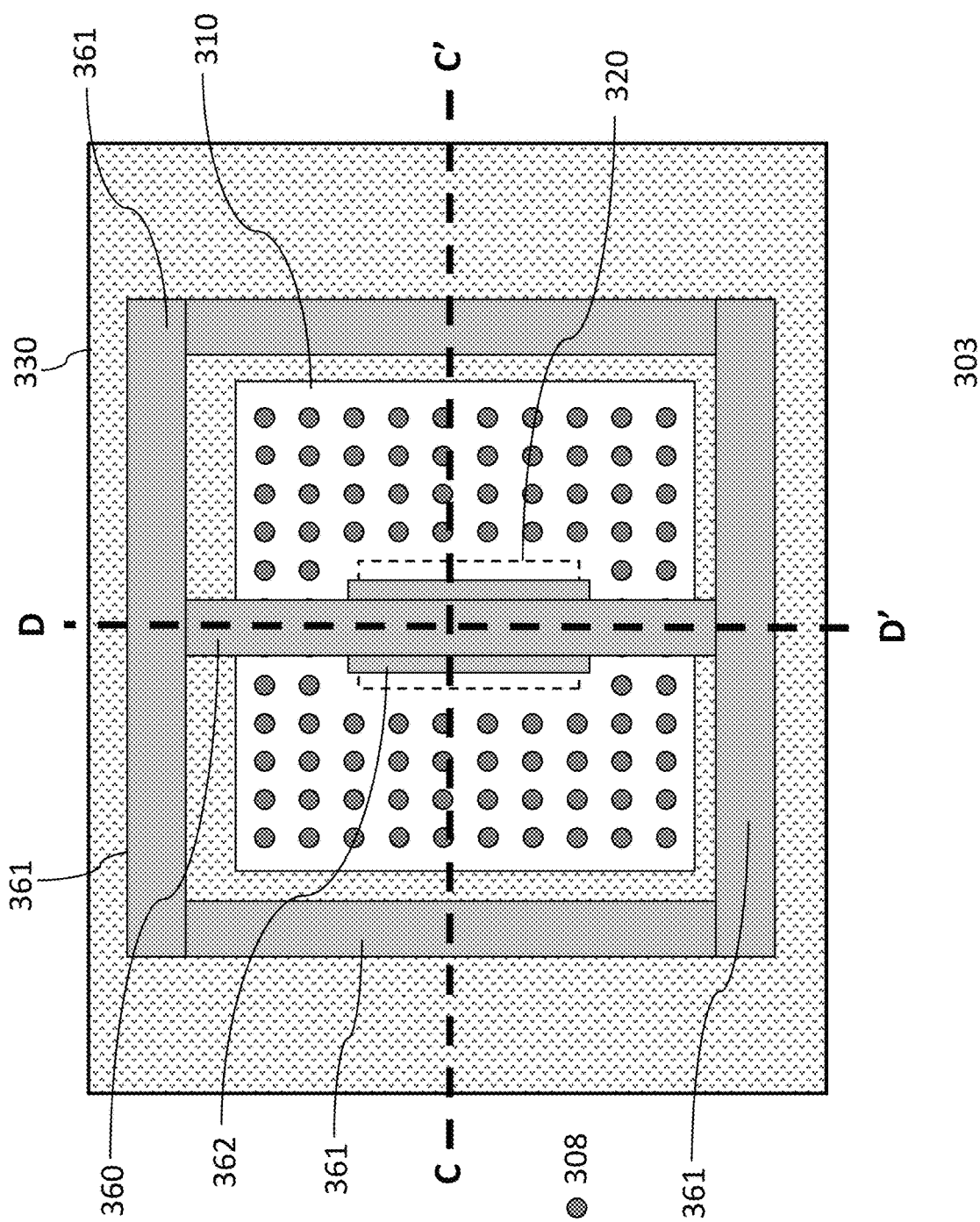
FIG. 3C is a diagram showing another layout of traces in a system on chip package with integrated ultraviolet light source in one embodiment.

FIG. 3C is a diagram showing a layout of traces in a system on chip package with integrated ultraviolet light source in one embodiment. The example shown in FIG. 3C presents a layout of the traces 360 and 362 that can be visible in a view 303, where the view 303 can be a bottom view as indicated by a dotted arrow in FIG. 3A and FIG. 3B. A section C-C' in FIG. 3A that spans across the traces 360 and 362 is shown in FIG. 3C. The traces 362 can be in contact with the light source 320 and the traces 360. Another section D-D' in FIG. 3B can be visible in the view 303 as shown in FIG. 3C. The section D-D' can span along the traces 360, where the traces 360 can be in contact with the traces 362. The traces 360 and the traces 362 can be parallel to each other, and the orientation and position of the trances 360 and traces 362 can be dependent on a desired implementation of the chip package 300.

The orientation and position of the trances 360 and traces 362 can be dependent on a desired implementation of the chip package 300. The size of the traces 360 and 362 can also be adjustable, and can be based on a desired implementation of the chip package 300. Further, the size, shapes, orientation, and positions of the traces 360, 362 can be based on the size and positions of the light source 320, the UV erasable area of the computer chip 310, and the bond pads (e.g., 307, 308). The traces 360 and 362 can also be co-designed with electrical C4 escape to prevent the traces 360 and 362 from interfering with the carrier 302.

By contacting the light source 320 and the traces 360, the traces 362 can be implemented as a heat pipe that transfers heat dissipated from the light source 320 to the traces 360. The heat can flow from the traces 360 to the seals 361, and from the seals 361 to the package lid 330. The combination of the traces 360, 362, and the package lid 330 can provide a network of thermal pipe to facilitate cooling of the light source 320. Further, the computer chip 310 can also be cooled based on the computer chip 310 being integrated with the light source 320.

Figure 4A:
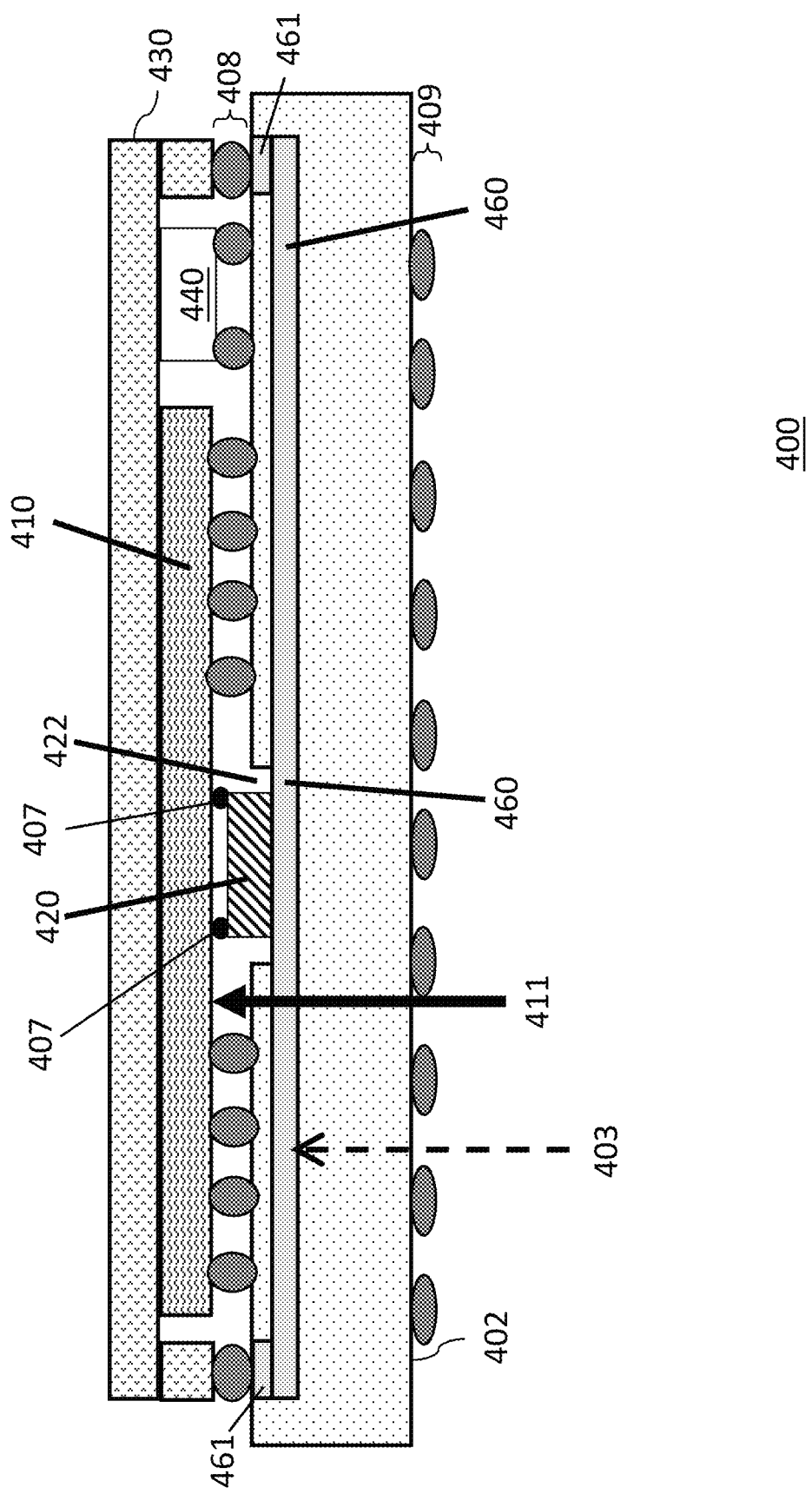
FIG. 4A is a diagram showing a cross section of another chip package that can be implemented as a system on chip package with integrated ultraviolet light source in one embodiment.

FIG. 4A is a diagram showing a cross section of a chip package 400 that can be implemented as a system on chip package with integrated ultraviolet light source in one embodiment. The chip package 400 can include a computer chip 410, a light source 420, and a carrier 402. The computer chip 410 can be, for example, an artificial intelligence computer chip, or a computer chip that may require UV exposure to change the conductivity, threshold, or other state of structures or devices contained there-in. The carrier 402 can be a printed circuit board (PCB), and can be made of organic materials. The light source 420 can be a UV light source configured to emit light of UV wavelength. In the example shown in FIG. 4A, the chip package 400 can be a multi-chip package including more than one computer chip or components. For example, the chip package 400 can further include one or more components 440 that can be, for example, processors, memories, surface mount components such as capacitors, resistors, and/or other types of components.

The light source 420 can be bonded or mounted to the surface 411 of the computer chip 410 using an array of bond pads 407. The surface 411 can include UV erasable areas (e.g., UV erasable area 170 in FIG. 1B or UV erasable area 171 in FIG. 1C). The light source 420 can be flip-chip mounted to a UV erasable area on the surface 411 of the computer chip 410. The flip-chip mounting of the light source 420 can allow the light source 420 to emit light towards the surface 411 of the computer chip 410. The surface 411 can be a top surface of the computer chip 410. For example, processing and memory components of the computer chip 410 can be exposed on the surface 411. The computer chip 410 can be bonded or mounted to the carrier 402 using an array of bond pads 408. In the example shown in FIG. 4A, the computer chip 410 can be flip-chip mounted to a surface of the carrier 402. The arrays of bond pads 407, 408 can be controlled collapse chip connection (C4) solder bumps. The light source 420 can be a UV light source including a single lens (e.g., lens 172 in FIG. 1B) or a UV light source including an array of lenses (e.g., array of lenses 174 in FIG. 1C). In the example shown in FIG. 4A, a recess 422 can be formed on a surface of the carrier 402 to accommodate or fit the light source 420 upon mounting the computer chip 410 to the carrier 402. For example, the recess 422 can fit relatively thicker UV light source chips, or can allow the computer chip 410 to be flip-chip mounted to the carrier 402 using relatively smaller bond pads (e.g., bond pads 408). The one or more components 440 can be flip-chip mounted to the carrier 402 using an array of bond pads that can be same or different from the bond pads 408. The carrier 402 can also include another layer of bond pads 409 that can be used to bond or mount the chip package 400 to another package or device.

Further, thermally conductive paths can be installed in at least a portion of the recess 422 to cool the light source 420 and/or the computer chip 410. For example, the chip package 400 can further include a package lid 430, one or more traces 460, and one or more seals 461. The package lid 430 can be a conductive lid and can be made of, for example, copper. Note that other packaging lid materials are possible. The traces 460 can be copper organic PCB traces that can be in contact with the light source 420, and can be installed in at least a portion of the recess 422. The traces 460 can be made of thermally interface materials or copper conductors, and can be implemented as thermally conductive paths to cool the light source 420 and/or the computer chip 410. The seals 461 can be hermetical metal seals made of, for example, copper, and can be solder between the package lid 430 and the traces 460. The combination of the package lid 430, the traces 462, and the seals 461 can provide a thermally conductive path to cool the light source 420 and/or the computer chip 410. In some examples, a heat sink can be disposed on the package lid 430 to provide additional cooling capabilities.

Figure 4B:
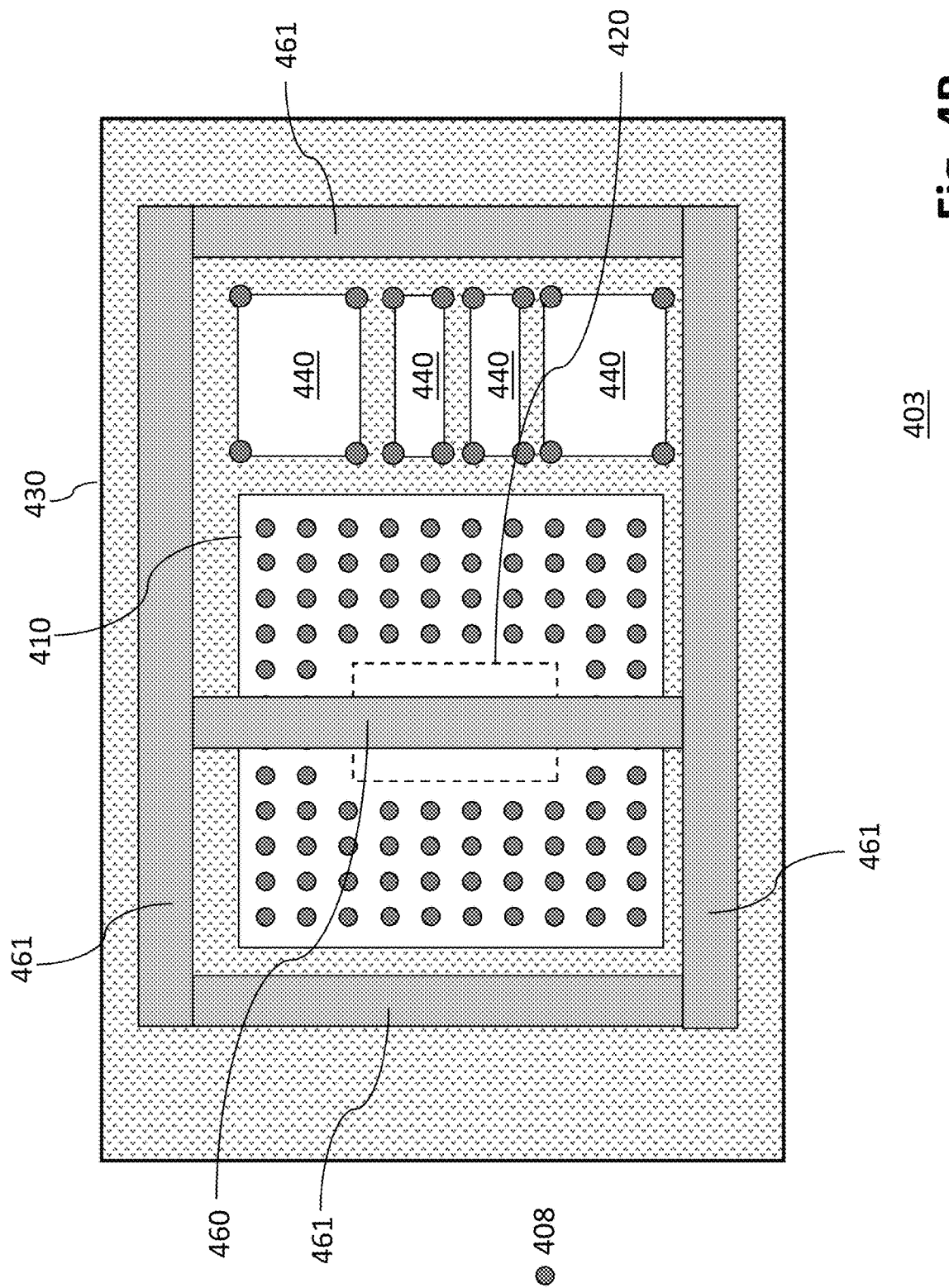
FIG. 4B is a diagram showing another layout of traces in a system on chip package with integrated ultraviolet light source in one embodiment.

FIG. 4B is a diagram showing a layout of traces in a system on chip package with integrated ultraviolet light source in one embodiment. The example shown in FIG. 4B presents a layout of the traces 460 that can be visible in a view 403, where the view 403 can be a bottom view as indicated by a dotted arrow in FIG. 4A. The traces 460 can span from one seal 461 to another seal 461, and can be in contact with the light source 420. The orientation and position of the traces 460 can be dependent on a desired implementation of the chip package 400. The size of the traces 460 can also be adjustable, and can be based on a desired implementation of the chip package 400. Further, the size, shapes, orientation, and positions of the traces 460 can be based on the size and positions of the light source 420, the UV erasable area of the computer chip 410, and the bond pads (e.g., 407, 408). The traces 460 can also be co-designed with electrical C4 escape to prevent the traces 460 and 462 from interfering with the carrier 402. Further, as shown in FIG. 4B, one or more components 440, of same or different sizes and/or shapes, can be mounted to the carrier 402 using bond pads.

By contacting the light source 420, the traces 460 can be implemented as a heat pipe that transfers heat dissipated from the light source 420 to other traces, the seals 461, and the package lid 430. The combination of the traces 460, the seals 461, and the package lid 430 can provide a network of thermal pipe to facilitate cooling of the light source 420. Further, the computer chip 410 can also be cooled based on the computer chip 410 being integrated with the light source 420.

Figure 5A:
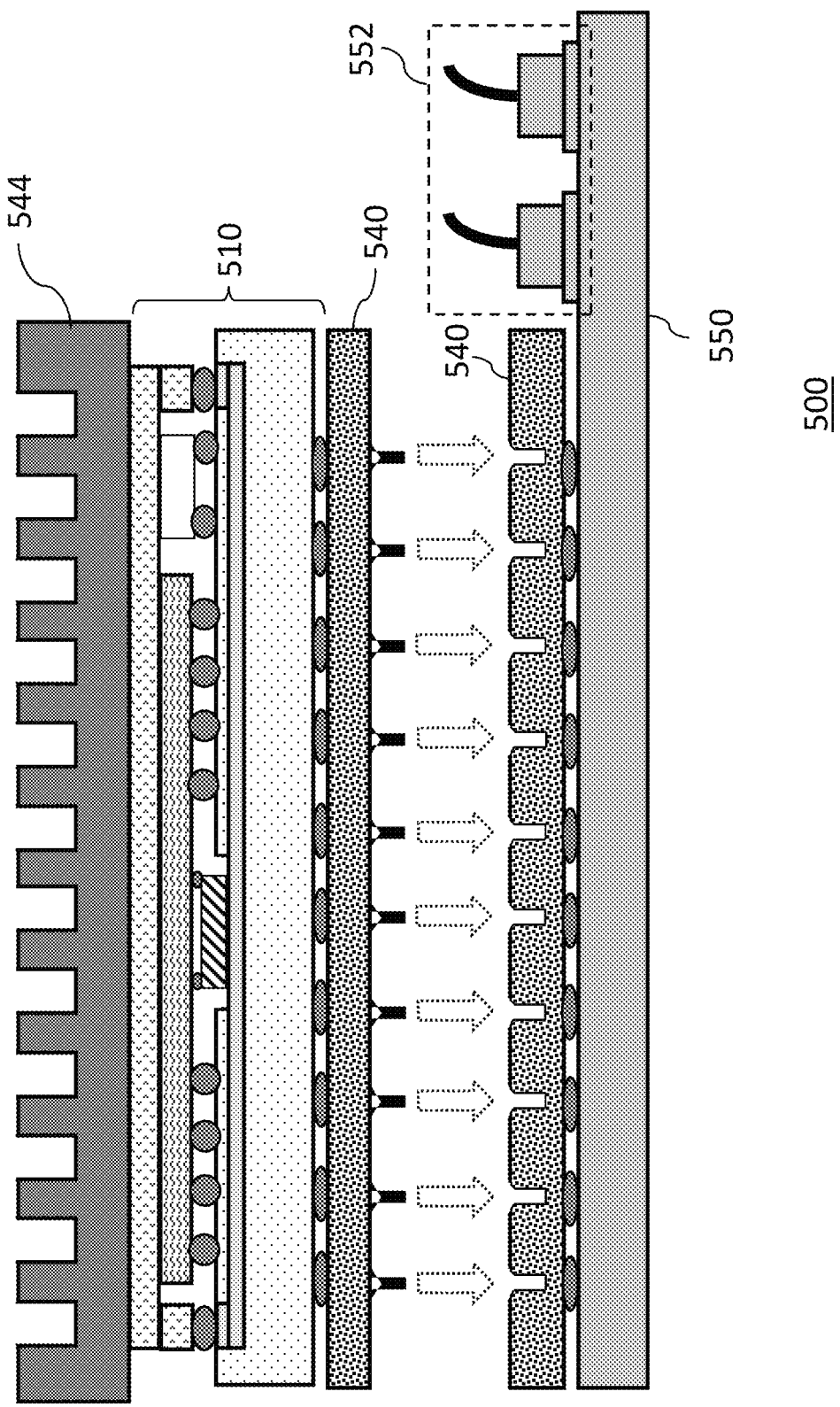
FIG. 5A is a diagram showing a cross section of a system that includes a system on chip package with integrated ultraviolet light source in one embodiment.
Figure 5B:
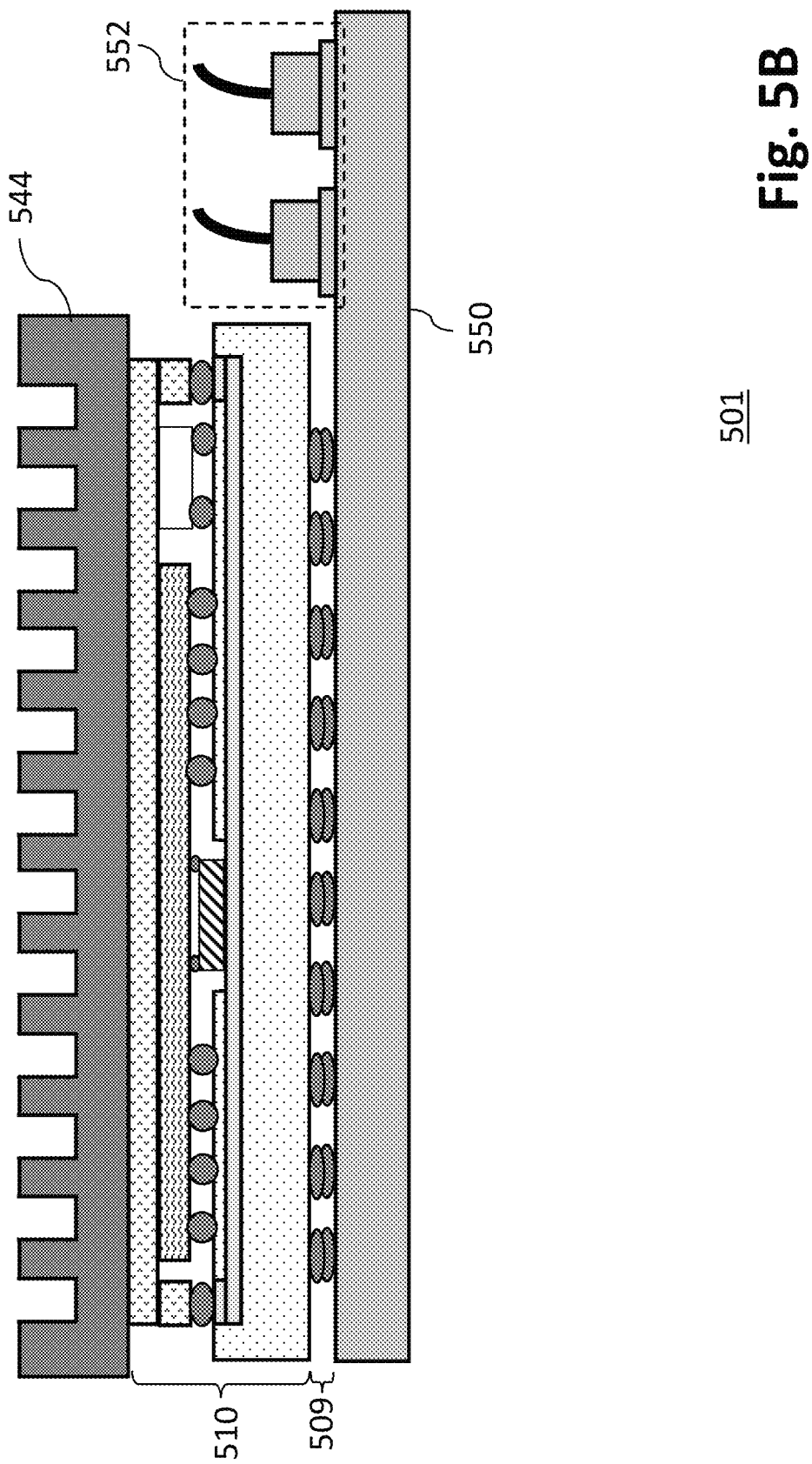
FIG. 5B is a diagram showing a cross section of another system that includes a system on chip package with integrated ultraviolet light source in one embodiment.

FIG. 5A is a diagram showing a cross section of a system 500 that includes a system on chip package with integrated ultraviolet light source in one embodiment. The system 500 can include a chip package 510 mounted on a printed circuit board (PCB) 550 using a pin grid array (PGA) connector 540. The pins of the PGA connector 540 can be mounted to the chip package 510, and the sockets of the PGA connector 540 can be mounted to the PCB 550. The chip package 510 can be, for example, one of the chip packages 100, 200, 300, and 400, described in accordance with the present disclosure. A heat sink 544 can be disposed on top of a package lid of the chip package 510 to facilitate cooling of components among the chip package (e.g., UV light source and computer chips). In another example shown in FIG. 5B, the chip package 510 can be mounted to the PCB 550 using, for example, a set of bond pads (e.g., C4 solder bumps) 509.

A set of connectors 552 can be mounted on the PCB 550, where the connectors 552 can be, for example, sub-miniature push-on (SMP) connectors, edge connectors, and/or other types of connectors that can be connected to another device, component, or another chip package. The connection of the system 500 to another component via the connectors 552 can provide communication of signals between the chip package 510 and the component connected to the connectors 552. Electrical signals can be communicated between the chip package 510 and the component connected to the connectors 552 by using transmission lines that can be integrated in the PCB 550. In an example, a light source integrate with the chip package 510 can perform UV erasing on a computer chip of the chip package 510 in scenarios where the chip package 510 is connected to PCB 550.

Figure 6:
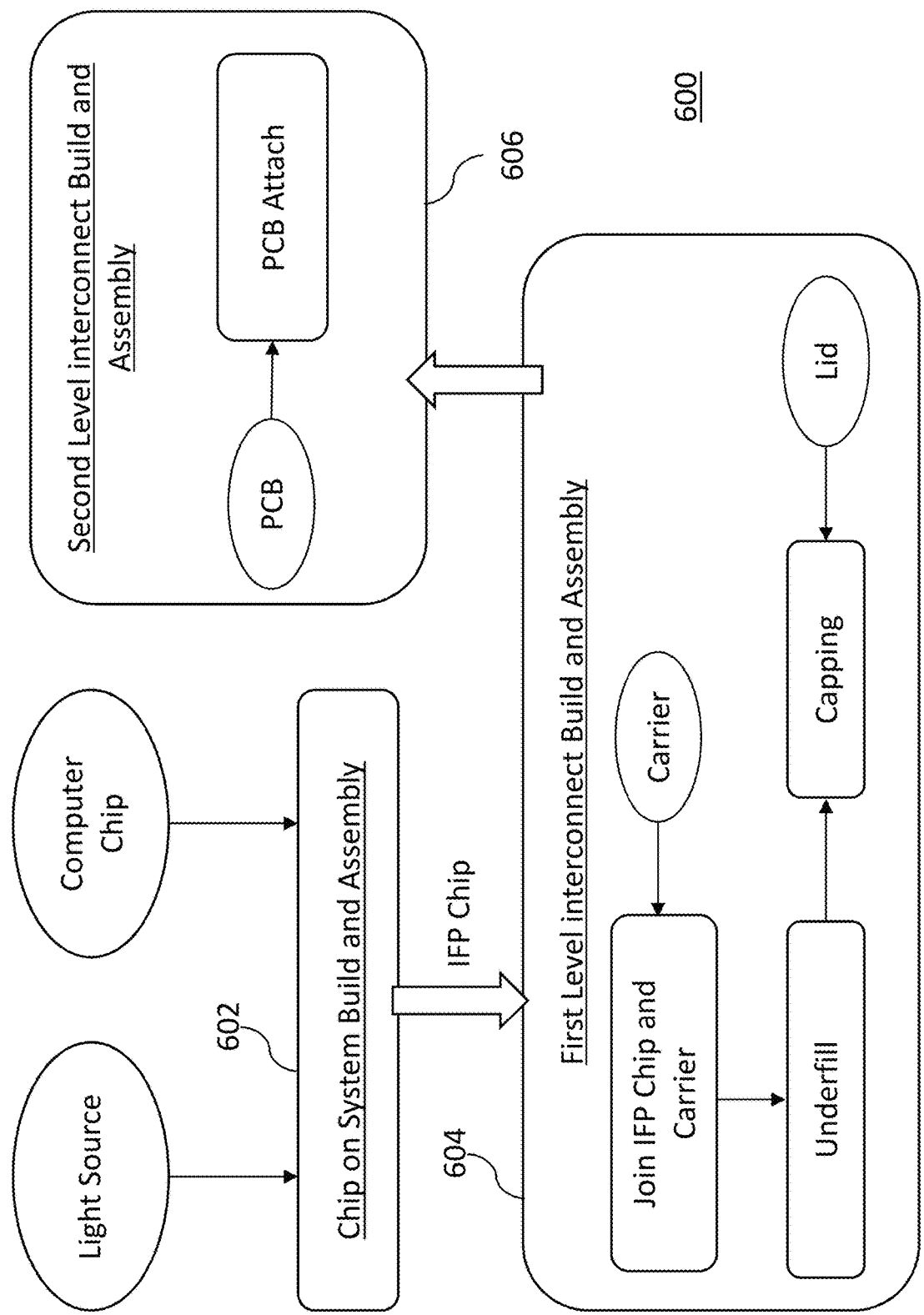
FIG. 6 is a flow diagram illustrating a method of implementing a process relating to a system on chip package with integrated ultraviolet light source in one embodiment.

FIG. 6 is a flow diagram illustrating a method of implementing a process 600 relating to a system on chip package with integrated ultraviolet light source in one embodiment. The example process 600 may include one or more operations, actions, or functions as illustrated by one or more of blocks 602, 604, and/or 606. Although illustrated as discrete blocks, various blocks can be divided into additional blocks, combined into fewer blocks, eliminated, or performed in parallel, depending on the desired implementation.

The process 600 can begin at block 602, where a chip on system build and assembly process can be performed. At block 602, the light source can be flip-chip mounted on the computer chip to form an in-field programmable (IFP) chip. Solder reflow can be performed using, for example, gold-tin (Au—Sn) eutectic bonding. An underfill, that can be clear underfill material such as polymer or liquid, can be applied on the IFP chip after the solder reflow. Strengthening fluids can also be applied to reinforce the bonding between the light source and computer chip.

The process 600 can continue from block 602 to block 604, where a first level interconnect build and assembly process can be performed. A first level interconnect package can be, for example, a chip package (e.g., chip package 100, 200, 300, 400, or 510) having the IFP chip and other packaging components such as carrier, package lid, etc., as described in accordance with the present disclosure. The block 602 can begin with a process to join the IFP chip with a carrier, such as a carrier made of organic materials. The IFP chip can be joined to the carrier by flip-chip mounting the IFP chip on the carrier. Strengthening fluids can also be applied to reinforce the bonding between the IFP chip and the carrier. A thermal interface can be dispensed between the light source and copper heat pipe formed in the carrier. Dispensing the thermal interface can electrically isolate the light source from the carrier. Solder reflow using lead-free tin-silver-copper (Pb-free SAC) can also be performed to bond the IFP chip to the carrier. Underfill materials can be dispensed to strengthen the bonding between the IFP chip and the carrier. A capping process can be performed to dispose a package lid on the IFP chip. Thermal interface can be dispensed between the IFP chip and the lid. A low temperature melt can be performed to melt new solder joints (e.g., C4 bumps) that can be used to bond the IFP chip to the lid.

The process 600 can continue from block 604 to block 606, where a second level interconnect build and assembly process can be performed. A second level interconnect package can be, for example, a printed circuit board (PCB) that can connect the first level interconnect package (e.g., chip package 100, 200, 300, 400, or 510) to another device, component, or chip package. The first level interconnect package can be mounted to a PCB, where the PCB can be made of organic substrate. The first level interconnect package can be bonded to the PCB board using, for example, ball grid array (BGA) solder reflow techniques. Further cleaning and curing can be performed in block 604 to remove flux, contaminates, and marks that may result from the process 600. A system on chip (SoC) device (e.g., system 501 in FIG. 5B) can result from a completion of the block 604.

Figure 7:
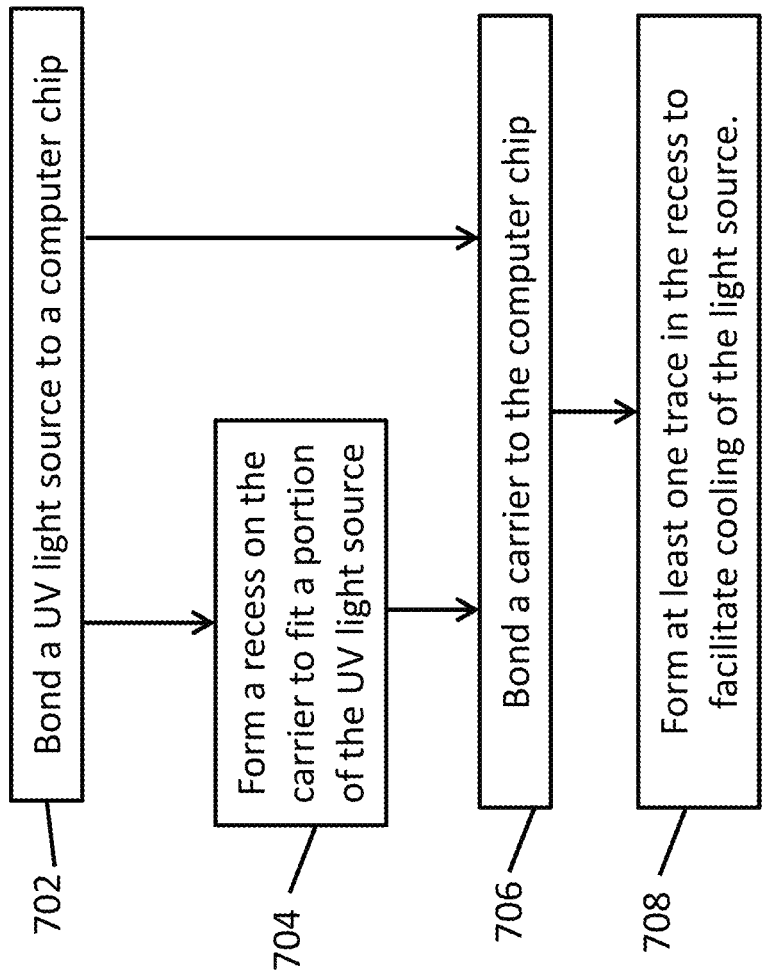
FIG. 7 is another flow diagram illustrating a method of implementing a process relating to a system on chip package with integrated ultraviolet light source in one embodiment.

FIG. 7 is a flow diagram illustrating a method of implementing a process 700 relating to a system on chip package with integrated ultraviolet light source in one embodiment. An example process may include one or more operations, actions, or functions as illustrated by one or more of blocks 702, 704, 706, and/or 708. Although illustrated as discrete blocks, various blocks can be divided into additional blocks, combined into fewer blocks, eliminated, or performed in parallel, depending on the desired implementation.

The process 700 can be implemented to fabricate a programmable device. The process 700 can begin at block 702, where a UV light source can be bonded to a computer chip by flip-chip mounting the UV light source to the computer chip. The UV light source can be configured to emit UV light towards a UV erasable area of the computer chip to perform UV erasing on the computer chip. The computer chip can include an electrically programmable read only memory (EPROM). The UV light source can be based on Gallium Nitride (GaN) technology.

In some example embodiments, the process 700 can continue from block 702 to block 706. In other example embodiments, the process 700 can continue from block 702 to block 704, where a recess can be formed on the carrier to fit a portion of the UV light source. At block 706, a carrier can be bonded to the computer chip by flip chip mounting the computer chip to the carrier using a second array of bond pads. In some example embodiments, the process 700 ca continue from the block 706 to the block 708. At block 708, at least one trace can be formed in the recess to facilitate cooling of the light source.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A chip package comprising:
   a computer chip;
   an ultraviolet (UV) light source;
   a carrier;
   wherein:
      the UV light source is flip-chip mounted to the computer chip using a first array of bond pads situated between the UV light source and the computer chip;
      the computer chip is flip-chip mounted to the carrier using a second array of bond pads situated between the computer chip and the carrier;
      the UV light source is configured to emit UV light towards a UV erasable area of the computer chip to perform UV erasing on the computer chip.

2. The chip package of claim 1, wherein the computer chip is a UV programmable chip.

3. The chip package of claim 1, wherein the computer chip comprises an electrically programmable read only memory (EPROM).

4. The chip package of claim 1, wherein the UV light source is based on Gallium Nitride (GaN) technology.

5. The chip package of claim 1, wherein the UV light source comprises a single lens.

6. The chip package of claim 1, wherein the UV light source comprises a lens array having more than one lens.

7. A chip package comprising:
a computer chip;
an ultraviolet (UV) light source;
a carrier;
wherein:
- the UV light source is flip-chip mounted to the computer chip using a first array of bond pads situated between the UV light source and the computer chip;
- the computer chip is flip-chip mounted to the carrier using a second array of bond pads situated between the computer chip and the carrier;
- the carrier comprises a recess to fit a portion of the UV light source; and
- the UV light source is configured to emit UV light towards a UV erasable area of the computer chip to perform UV erasing on the computer chip.

8. The chip package of claim 7, wherein a trace is installed in the recess of the carrier to facilitate cooling of the light source.

9. The chip package of claim 7, further comprising a lid disposed on the computer chip.

10. The chip package of claim 9, further comprising a heat sink disposed on the lid.

11. The chip package of claim 7, wherein the computer chip is a UV programmable chip.

12. The chip package of claim 7, wherein the computer chip comprises an electrically programmable read only memory (EPROM).

13. The chip package of claim 7, wherein the UV light source is based on Gallium Nitride (GaN) technology.

14. The chip package of claim 7, wherein the UV light source comprises a single lens.

15. The chip package of claim 7, wherein the UV light source comprises a lens array having more than one lens.

16. A method of fabricating a programmable device, the method comprising:
- bonding a UV light source to a computer chip by flip-chip mounting the UV light source to the computer chip, wherein the UV light source is configured to emit UV light towards a UV erasable area of the computer chip to perform UV erasing on the computer chip; and
- bonding a carrier to the computer chip by flip chip mounting the computer chip to the carrier using a second array of bond pads.

17. The method of claim 16, further comprising forming a recess on the carrier to fit a portion of the UV light source.

18. The method of claim 17, further comprising forming at least one trace in the recess to facilitate cooling of the UV light source.

19. The method of claim 16, wherein the computer chip comprises an electrically programmable read only memory (EPROM).

20. The method of claim 16, wherein the UV light source is based on Gallium Nitride (GaN) technology.

* * * * *